(12) United States Patent
Hegde

(10) Patent No.: US 6,832,410 B2
(45) Date of Patent: Dec. 21, 2004

(54) HIGH PERFORMANCE COOLING DEVICE WITH SIDE MOUNT FAN

(75) Inventor: Shankar Hegde, Annassandrapalya Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/133,696

(22) Filed: Apr. 23, 2002

(65) Prior Publication Data

US 2003/0196780 A1 Oct. 23, 2003

(51) Int. Cl.[7] ................................................. H05K 7/20
(52) U.S. Cl. .................... 16/80.3; 165/121; 165/185; 174/16.3; 257/722; 361/697; 361/704
(58) Field of Search ................ 165/80.3, 121, 165/122, 185; 174/16.3; 257/722, 720; 361/697, 704

(56) References Cited

U.S. PATENT DOCUMENTS

| | | | | | |
|---|---|---|---|---|---|
| 3,147,802 A | * | 9/1964 | Katz | ........................... | 165/185 |
| 3,163,207 A | * | 12/1964 | Schultz | ........................ | 165/185 |
| 3,566,958 A | * | 3/1971 | Zelina | ......................... | 165/80.3 |
| 4,557,225 A | * | 12/1985 | Sagues et al. | ............. | 165/80.3 |
| 5,594,623 A | * | 1/1997 | Schwegler | ................... | 361/697 |
| 6,097,601 A | * | 8/2000 | Lee | ............................. | 361/704 |
| 6,101,091 A | * | 8/2000 | Baik | ........................... | 361/704 |
| 6,189,601 B1 | * | 2/2001 | Goodman et al. | .......... | 165/80.3 |
| 6,343,014 B1 | * | 1/2002 | Lin | ............................. | 361/697 |
| 6,446,708 B1 | * | 9/2002 | Lai | ............................. | 165/80.3 |
| 6,450,249 B1 | * | 9/2002 | Liu | ............................. | 165/80.3 |
| 6,501,651 B2 | * | 12/2002 | Lin et al. | ..................... | 361/697 |
| 6,680,015 B2 | * | 1/2004 | McCullough | ............... | 257/720 |

* cited by examiner

Primary Examiner—Leonard R. Leo
(74) Attorney, Agent, or Firm—Trueman H. Denny, III

(57) ABSTRACT

A side flow cooling device is disclosed. The side flow cooling device includes a heat mass with arms extending therefrom and a mounting surface for connecting the heat mass with a component to be cooled. The heat mass and the arms include a plurality of fins extending outward therefrom and aligned with a vertical axis of the heat mass. The fins have cooling surfaces and a slot between adjacent fins that are aligned with a longitudinal axis of the heat mass. A fan or the like can be connected with a side face of the cooling device to generate an air flow that is substantially along the longitudinal axis. The air flow wets over the cooling surfaces of the fins, on exposed portions of the heat mass, and on exposed portions of the arms to dissipate heat from the heat mass. The heat mass is not covered by the fan and therefore the fins can populate a substantial portion of a surface area of the heat mass thereby increasing the surface area available for cooling.

20 Claims, 14 Drawing Sheets

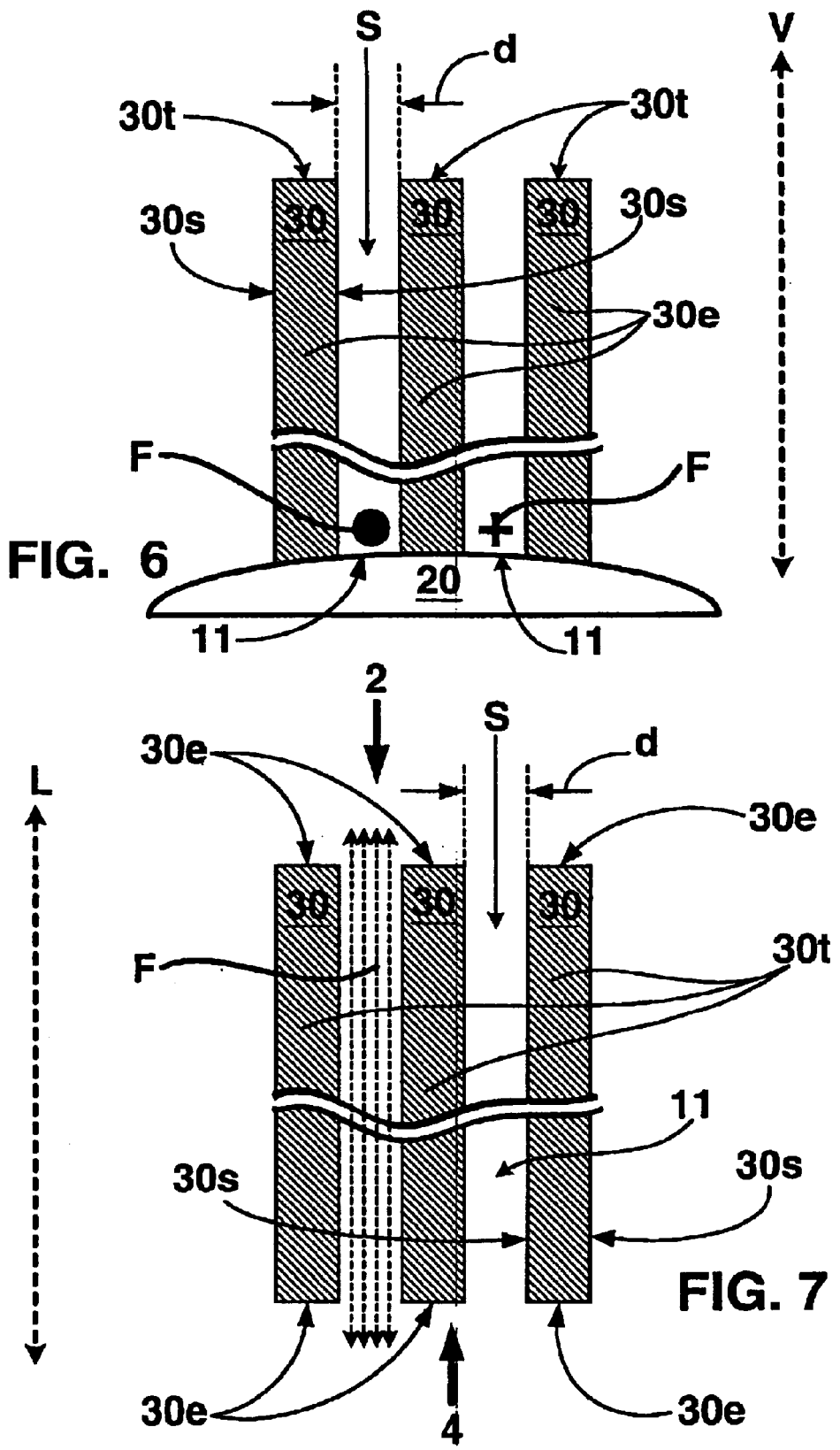

HIGH PERFORMANCE COOLING DEVICE WITH SIDE MOUNT FAN

FIELD OF THE INVENTION

The present invention relates generally to a side flow cooling device for removing heat from a component connected with the side flow cooling device. More specifically, the present invention relates to a side flow cooling device including a heat mass and a plurality of vertically oriented fins built around the heat mass. Heat in the heat mass spreads vertically into the fins. Cooling surfaces of the fins and a slot between the fins are aligned with a longitudinal axis of the heat mass so that an air flow for dissipating heat from the fins can be generated by an air flow source positioned at a side face of the side flow cooling device.

BACKGROUND OF THE INVENTION

It is well known in the electronics art to place a heat sink in contact with an electronic device so that waste heat generated by operation of the electronic device is thermally transferred into the heat sink thereby cooling the electronic device. With the advent of high clock speed electronic devices such as microprocessors ($\mu$P), digital signal processors (DSP), and application specific integrated circuits (ASIC), the amount of waste heat generated by those electronic devices and the operating temperature of those electronic devices are directly proportional to clock speed. Therefore, higher clock speeds result in increased waste heat generation which in turn increases the operating temperature of the electronic device. However, efficient operation of the electronic device requires that waste heat be continuously and effectively removed.

Heat sink devices came into common use as a preferred means for dissipating waste heat from electronic devices such as the types described above. In a typical application, a component to be cooled is carried by a connector that is mounted on a PC board. A heat sink is mounted on the component by attaching the heat sink to the connector using a clip or fasteners, for example. Alternatively, the heat sink is mounted to a PC board that carries the electronic device and fasteners or the like are used to connect the heat sink to the PC board via holes that are drilled in the PC board.

Typically, a heat sink used in conjunction with a modern high clock speed electronic device will use an electrical fan mounted on top of the heat sink or within a cavity formed by cooling fins/vanes of the heat sink. The cooling fins increase the surface area of the heat sink and maximize heat transfer from the heat sink to ambient air that surrounds the heat sink. The fan causes air to circulate over and around the cooling fins thereby transferring heat from the cooling fins into the ambient air.

As mentioned previously, with continuing increases in clock speed, the amount of waste heat generated by electronic devices has also increased. Accordingly, to adequately cool those electronic devices, larger heat sinks and/or larger fans are required. Increasing the size of the heat sink results in a greater thermal mass and a greater surface area from which the heat can be dissipated. Increases in fan size provide for more air flow through the cooling fins.

There are disadvantages to increased fan and heat sink size. First, if the size of the heat sink is increased in a vertical direction (i.e. in a direction transverse to the PC board), then the heat sink will be taller and may not fit within a vertical space in the system that carries the heat sink, such as the chassis of a desktop computer.

Second, if the PC board has a vertical orientation, then a heavy and tall heat sink can mechanically stress the PC board and/or the electronic device resulting in a device or PC board failure.

Third, a tall heat sink will require additional vertical clearance between the heat sink and a chassis the heat sink is contained in to allow for adequate air flow into or out of the fan.

Fourth, when the heat sink has a cylindrical shape formed by the fins it is often not possible to mount several such heat sinks in close proximity to each other because air flow into and out of the fins is blocked by adjacent heat sinks with a resulting decrease in cooling efficiency.

Finally, increases in fan size to increase cooling capacity often result in increased noise generation by the fan. In many applications such as the desktop computer or a portable computer, it is highly desirable to minimize noise generation. Moreover, in portable applications that depend on a battery to supply power, the increased power drain of a larger fan is not an acceptable solution for removing waste heat.

In the above mentioned heat sink with cooling fins there are additional disadvantages to mounting the fan within a cavity formed by the fins. First, a substantial portion of a heat mass of the heat sink is blocked by the fan because the fan is mounted directly on the heat mass and therefore blocks a potential path for heat dissipation from the heat mass because air from the fan does not circulate over the blocked portion of the heat mass.

Second, without the fan, a depth of the fins could extend all the way to a center of the heat mass; however, the depth and surface area of the fins is reduced by a diameter of the fan because the fan is mounted in a cavity having a diameter that is slightly larger than the fans diameter to provide clearance for the fans blades. Consequently, the heat mass of the heat sink must be made broader to compensate for the reduced surface area of the fins. The broader heat mass increases the size, cost, and weight of the heat sink.

Third, the reduced depth of the fins makes it easier for the fins to be bent if damaged. One possible consequence of a bent fin is that it will contact and damage the fan blades and/or cause the fan to stall thereby damaging the fan or causing the fan to fail.

Fourth, because the fan is mounted in the cavity formed by the fins, power leads for the fan must be routed through a space between the fins. Sharp edges on the fins can cut the power leads or cause an electrical short. In either case, the result is that the fan will fail.

Lastly, glue is typically used to mount the fan to the heat sink and the glue can get into the fan and cause the fan to fail. Any of the above mentioned fan failure modes can lead to a failure of the electronic device the heat sink was designed to cool because air circulation generated by the fan is essential to effectively dissipate waste heat from the electronic device.

Consequently, there exists a need for a cooling device that includes a heat mass having one or more surfaces that are populated with as many fins as possible so that a surface area available for removal of waste heat is maximized. There is also a need for a cooling device that includes a heat mass that is not blocked by a fan so that the number of fins connected with the heat mass can be increased and an air flow from the fan can pass over the heat mass and the fins to dissipate waste heat. Additionally, there exists a need for a cooling device with a central heat mass having fins aligned along a longitudinal axis thereof so that vertical clearance requirements are reduced. Finally, there is a need for a cooling device adapted for mounting a fan on a side of the cooling device so that an air flow from the fan passes over the fins and the heat mass of the cooling device along a longitudinal axis and so that air can easily enter and exit the fan.

SUMMARY OF THE INVENTION

Broadly, the present invention is embodied in a side flow cooling device for dissipating heat from a component. Typically, the component is an electronic component or an electronic device; however, the side flow cooling device of the present invention can be used in conjunction with any heat producing device and is not limited to use with electronic devices or components.

The side flow cooling device of the present invention includes a heat mass with a top surface, a mounting surface for thermally connecting the heat mass with the component to be cooled, opposed side surfaces, and opposed end surfaces. An arm extending outward of the opposed side surfaces includes an upper surface and a lower surface. A rib is connected with the arm an extends from the arm in a downward direction. A wing is connected with the rib and extends outward of the rib.

A plurality of fins are connected with the top surface of the heat mass and the upper and lower surfaces of the arm. The fins are aligned with a vertical axis of the heat mass such that they extend outward of the surfaces they are connected with and are aligned along the vertical axis. Each fin includes a top edge, opposed end edges, and opposed cooling surfaces. The opposed end edges define a first side face and a second side face of the side flow cooling device. The fins are spaced apart and the space between adjacent cooling surfaces defines a slot. The slot and the cooling surfaces are aligned with a longitudinal axis of the heat mass.

An air flow entering either of the first or second side faces in a direction that is substantially along the longitudinal axis passes through the slots and over the cooling surfaces of the fins and over the heat mass to dissipate heat from the heat mass.

An air flow source such as a fan, for example, can be mounted to either one or both of the first and second side faces to generate the air flow. Because the air flow source is mounted horizontally with the side flow cooling device, the problems associated with vertically mounted fans are solved by the present invention. Furthermore, by side mounting the air flow source, air can easily enter and exit the air flow source without being blocked or otherwise obstructed by a chassis, other cooling devices, other components, or the like.

Another advantage to side mounting the air flow source is that two or more air flow sources can be mounted to the first and second side faces to either increase air flow, to provide redundancy in the event of failure of one or more of the air flow sources, or to provide a push-pull air flow wherein one air flow source pushes the air flow through the slots between the fins and another air flow source pulls the air flow through the slots.

Moreover, because the air flow source is side mounted, the heat mass is not blocked by the air flow source. Therefore, the number of fins in contact with the heat mass can be increased with a resulting increase in heat transfer from the heat mass into the fins.

Additionally, the surface area of the heat mass that is not covered by the fins is open to the air flow so that the air flow can pass over the heat mass and dissipate heat therefrom.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 6 depicts in greater detail a plurality of fins in a section dd of the cross-sectional view of FIGS. 4 and 11.

FIG. 7 depicts in greater detail a plurality of fins in a section ee of the top plan view of FIGS. 5 and 12.

DETAILED DESCRIPTION

Figure 1:
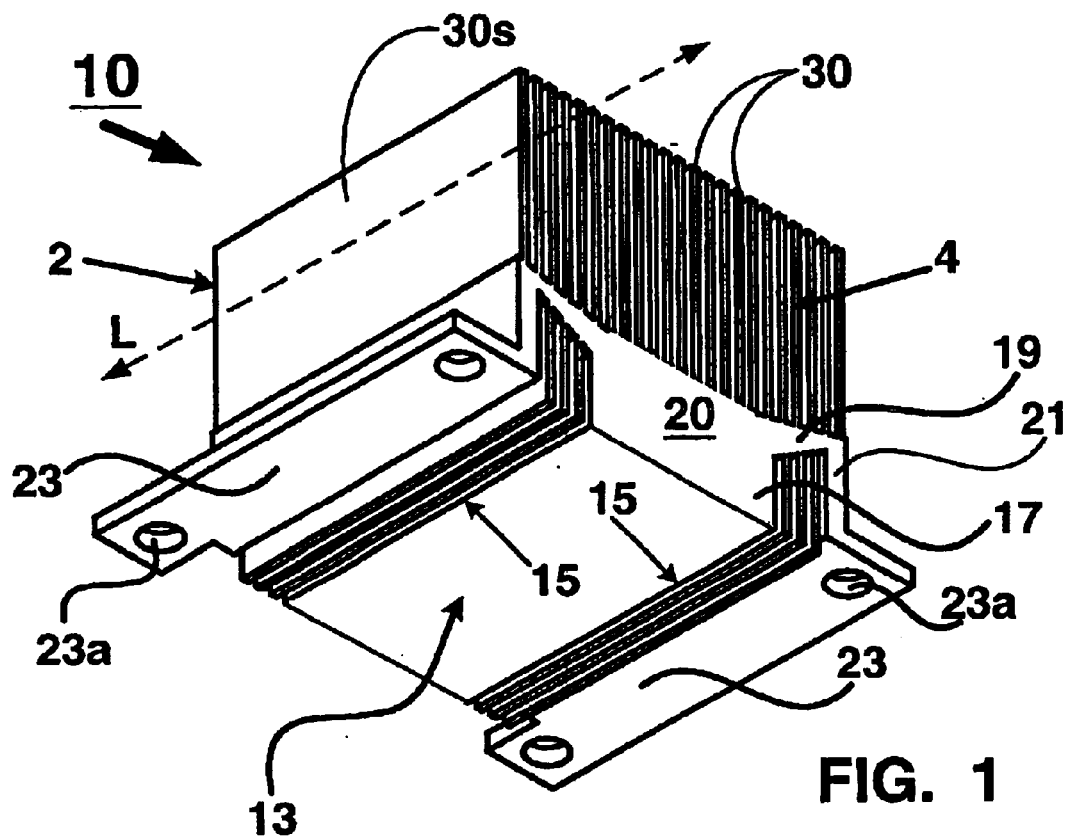
FIG. 1 is a bottom profile view of a side flow cooling device for dissipating heat from a component according to the present invention.

In the following detailed description and in the several figures of the drawings, like elements are identified with like reference numerals.

As shown in the drawings for purpose of illustration, the present invention is embodied in a side flow cooling device for dissipating heat from a component. The side flow cooling device of the present invention includes a heat mass with a top surface, a mounting surface, opposed side surfaces, and opposed end surfaces.

An arm extending outward of the opposed side surfaces includes upper and lower surfaces. A rib is connected with the arm an extends downward from the arm. A wing is connected with the rib and extends outward of the rib.

A plurality of fins are connected with the top surface of the heat mass and the upper and lower surfaces of the arm. The fins may also be connected with the opposed end surfaces of the heat mass. The fins extend outward of the surfaces they are connected with and are aligned along a vertical axis of the heat mass. Each fin includes a top edge, opposed end edges, and opposed cooling surfaces. The opposed end edges define a first side face and a second side face of the side flow cooling device. The fins are spaced apart to defines a slot between adjacent cooling surfaces. The slot and the cooling surfaces are aligned with a longitudinal axis of the heat mass.

An air flow entering either of the first or second side faces in a direction that is substantially along the longitudinal axis passes through the slots and over the cooling surfaces of the fins and over the heat mass to dissipate heat from the heat mass.

Figure 2:
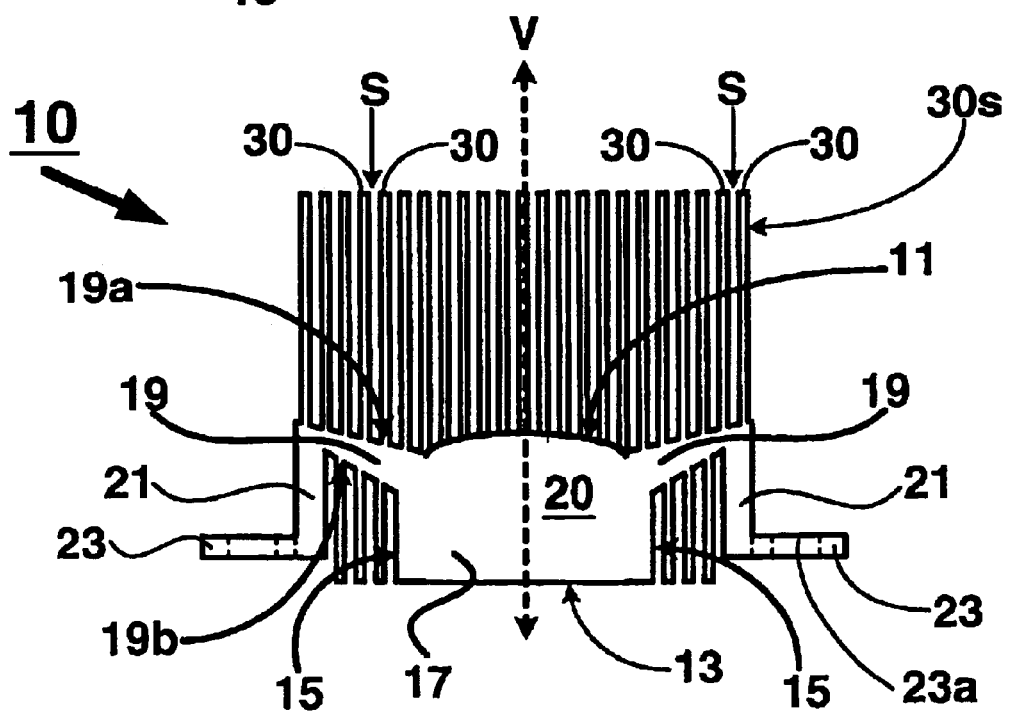
FIG. 2 is a cross-sectional view of the side flow cooling device of FIG. 1.
Figure 3:
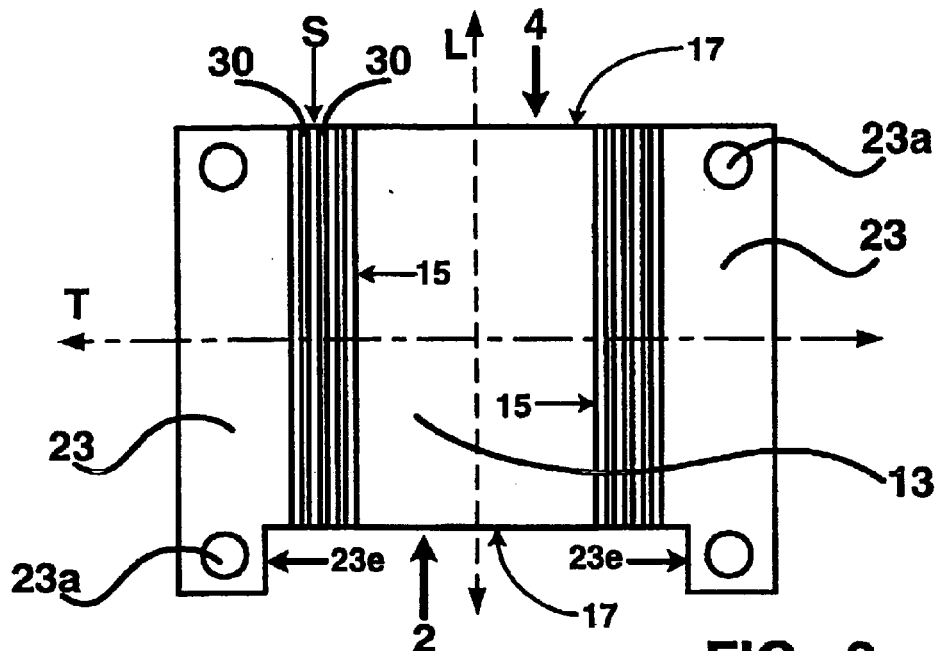
FIG. 3 is a bottom plan view of the side flow cooling device of FIG. 1.

In FIGS. 1, 2, and 3, a side flow cooling device 10 includes a heat mass generally designated as 20. The heat mass 20 includes a top surface 11, a mounting surface 13, opposed side surfaces 15 and opposed end surfaces 17. The mounting surface 13 is adapted to thermally connect the heat mass 20 with a component (not shown) to be cooled by dissipating heat from the component into the heat mass 20. The thermal connection between the heat mass 20 and the component can be by a direction connection of the mounting surface 13 with the component (see FIG. 21). That is, a surface of the component can be in direct physical contact with the mounting surface 13.

The side flow cooling device 10 also includes an arm 19 connected with the heat mass 20 and extending outward of the opposed side surfaces 15. The arm 19 includes an upper surface 19a and a lower surface 19b. A rib 21 is connected with the arm 19 and extends downward of the arm 19.

A wing 23 is connected with the rib and extends outward of the rib 21. The wing 23 is adapted to connect side flow cooling device 10 with the component. As will be discussed below, the connection of the side flow cooling device 10 with the component can be made using a variety of methods including using a fastener (not shown) to connect the side flow cooling device 10 with the component. For example, the wing 23 can include a plurality of apertures 23a that extend through the wing 23 and a fastener such as a screw can be inserted through the apertures 23a to connect the component with the side flow cooling device 10. The connection can be a direct connection with the component or an indirect connection with a connector or a PC board that carries the component, for example.

A plurality of fins 30 that are substantially aligned with a vertical axis V of the heat mass 20 are connected with the top surface 11 of the heat mass 20 and the upper and lower surfaces (19a, 19b) of the arm 19. In FIGS. 6 and 7, each fin 30 includes opposed cooling surfaces 30s, a top edge 30t, and opposed end edges 30e. Furthermore, the fins 30 are spaced apart d to define a slot S between adjacent cooling surfaces 30s. The slot S and the opposed cooling surfaces 30s are substantially aligned with a longitudinal axis L of the heat mass 20. The opposed end edges 30e define a first side face 2 and a second side face 4 of the side flow cooling device 10.

Figure 4:
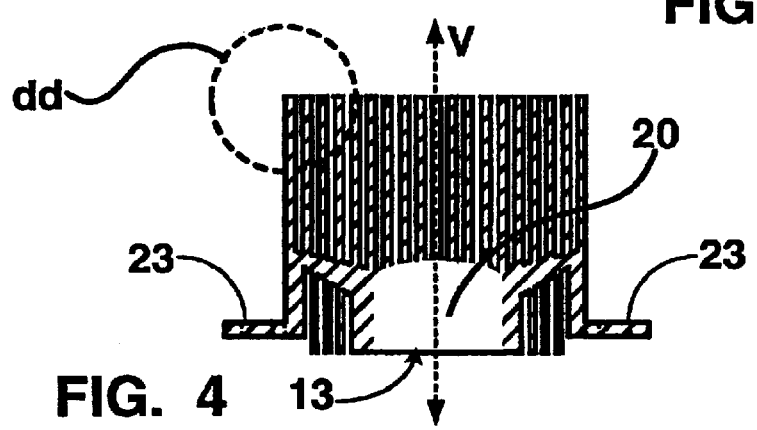
FIG. 4 is a cross-sectional view taken along line A—A of FIG. 5.
Figure 11:
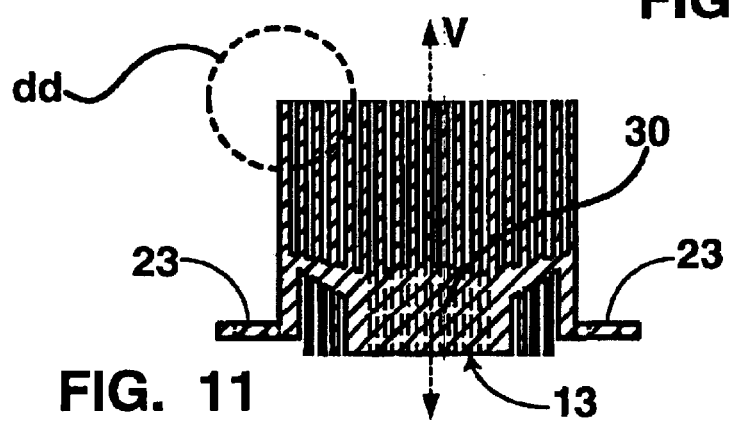
FIG. 11 is a cross-sectional view taken along line A—A of FIG. 12.

FIG. 6 is a detailed view of the fins 30 depicted in section dd of the cross-sectional view of FIGS. 4 and 11. The fins 30 are connected with the top surface 11 of the heat mass 20 and extend outward of the top surface 11 and are aligned with the vertical axis V.

Figure 5:
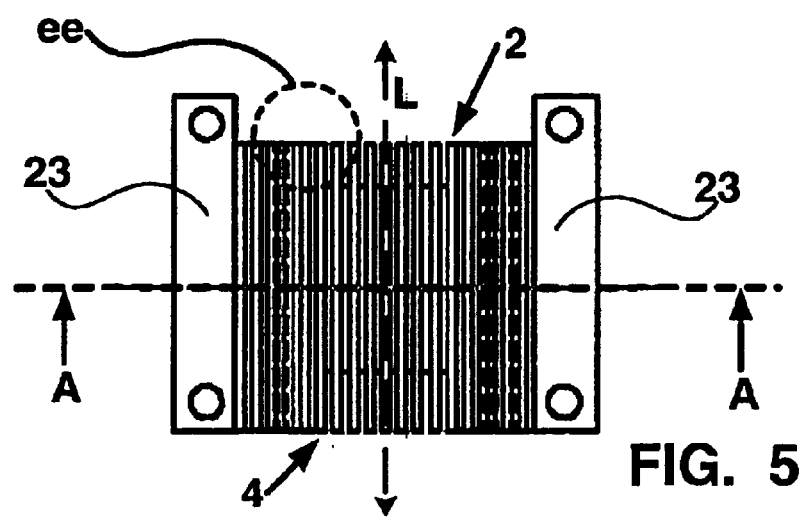
FIG. 5 is a top plan view of the side flow cooling device of FIG. 1.
Figure 8:
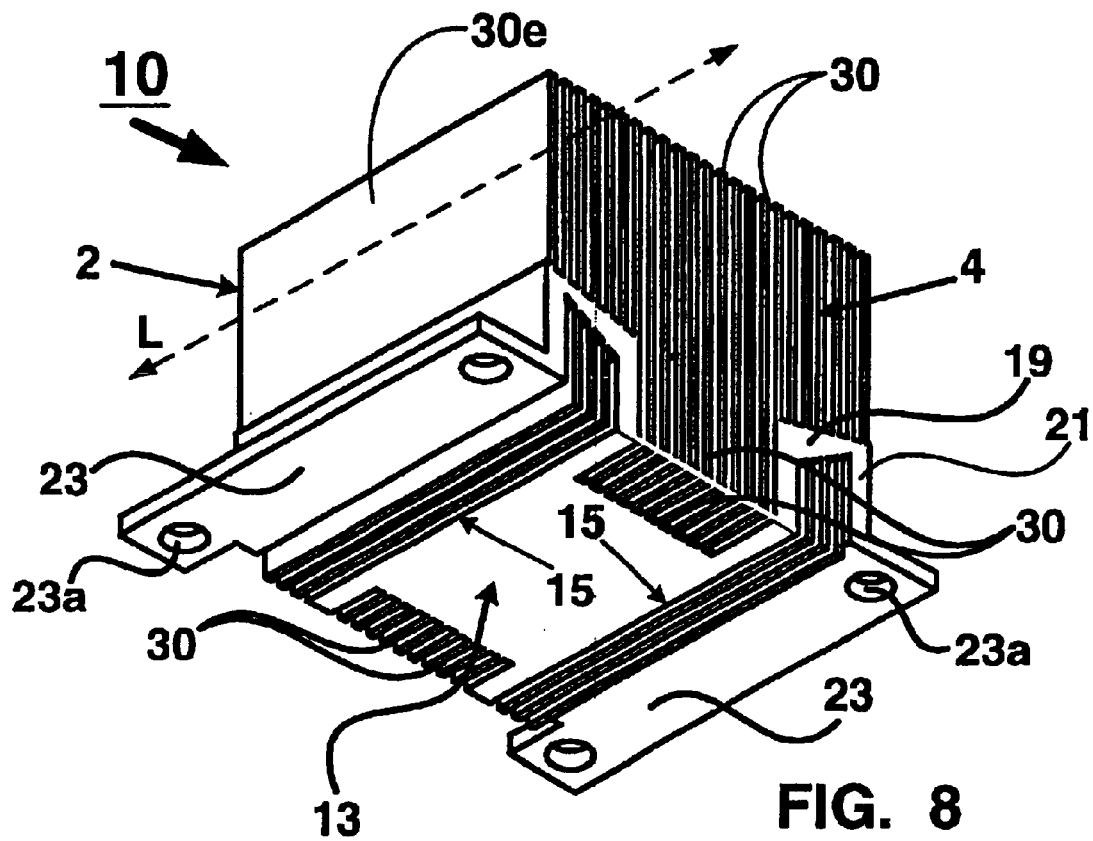
FIG. 8 is a bottom profile view of another embodiment of a side flow cooling device for dissipating heat from a component according to the present invention.
Figure 9:
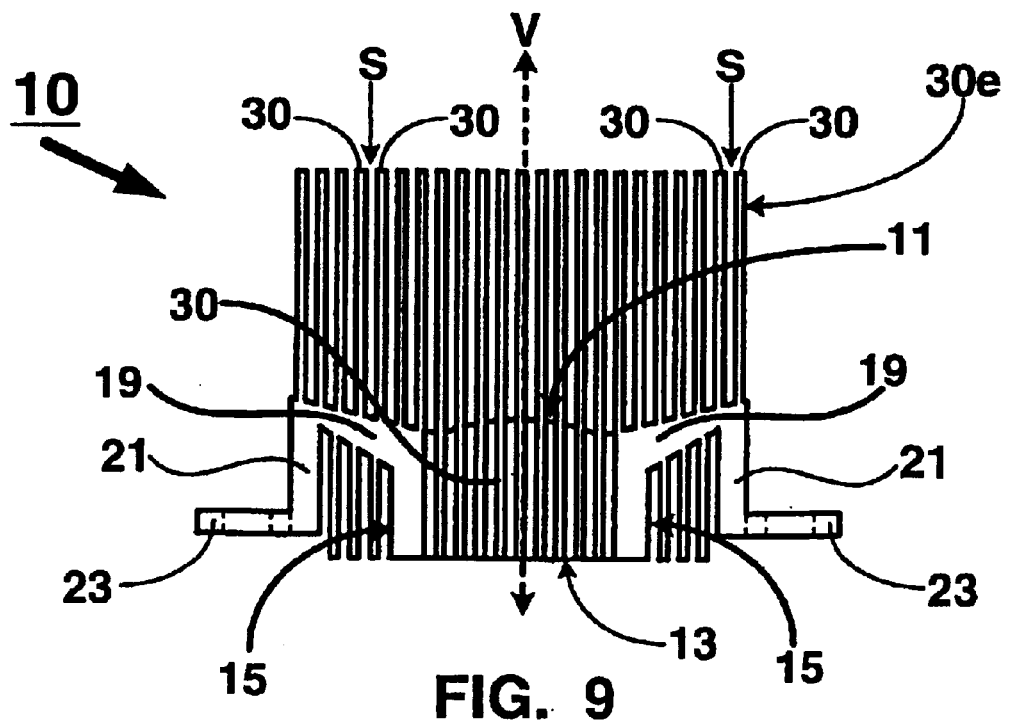
FIG. 9 is a cross-sectional view of the side flow cooling device of FIG. 8.
Figure 12:
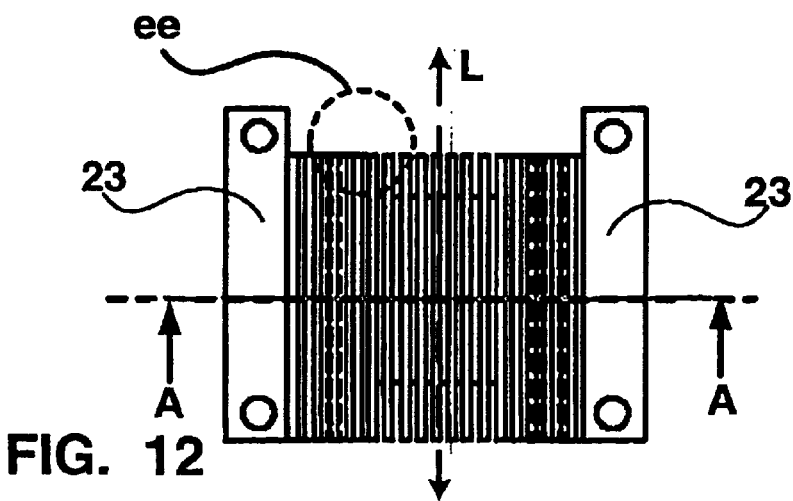
FIG. 12 is a top plan view of the side flow cooling device of FIG. 8.

FIG. 7 is a detailed view of the fins 30 depicted in section ee of the top plan view of FIGS. 5 and 12 (i.e. looking down at the top surface 11 of the heat mass 20). The opposed end edges 30e define the first and second faces (2, 4) of the side flow cooling device 10. The fins 30 are spaced apart by the distance d to define the slot S between adjacent cooling surfaces 30s. Both the slot S and the cooling surfaces 30s of the fins 30 are substantially aligned with the longitudinal axis L of the heat mass 20.

An air flow F entering either of the first and second faces (2, 4) in a direction that is substantially along the longitudinal axis L passes through the slot 2 and wets over the cooling surfaces 30s to dissipate heat from the heat mass 20. Additionally, in FIG. 6, the air flow F also passes over those portions of the heat mass 20 that are not populated with the fins 30 such that the air flow F wets over the exposed portions of the top surface 11 and dissipates heat from the heat mass 20. The air flow F can be along either direction of the longitudinal axis L.

In FIG. 6. the air flow F that wets over the top surface 11 and passes over the cooling surfaces 30s is depicted as being into the drawing sheet (+) or out of the drawing sheet (●); whereas, in FIG. 7, the air flow F is depicted by a bidirectional dashed arrow F. The air flow F also wets over the exposed portions of the upper and lower surfaces (19a, 19b) to remove additional heat from the heat mass 20. That is, those portions of the upper and lower surfaces (19a, 19b) that are not populated with the fins 30. Therefore, the illustration of FIG. 6 also applies to the air flow F that wets over the upper and lower surfaces (19a, 19b).

Figure 10:
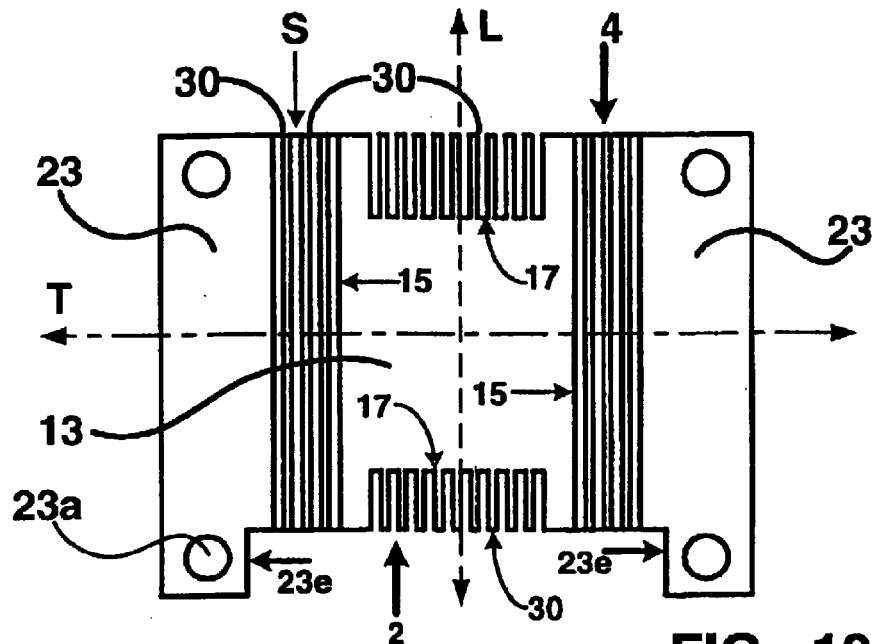
FIG. 10 is a bottom plan view of the side flow cooling device of FIG. 8.

In one embodiment of the present invention, as illustrated in FIGS. 8, 9, 10, 11, 12, and 13, a plurality of the fins 30 are connected with the opposed end surfaces 17 of the heat mass 20 and extend outward of the opposed end surfaces 17 (see FIG. 10). The fins 30 are substantially aligned with the vertical axis V of the heat mass 20 (see FIGS. 9, 11, and 13). The fins 30 on the opposed end surfaces 17 further increase heat dissipation from the heat mass 20 by increasing the surface area available for heat transfer to the air flow F. The fins 30 on the opposed end surfaces 17 also reduce the mass of the heat mass 20. That is, given equal dimensions for the side flow cooling device 10, the embodiments illustrated in FIGS. 1 and 3 will have a greater mass than the embodiments illustrated in FIGS. 8 and 10 because a volume of the heat mass 20 is reduced by the fins 30 that are connected with the opposed end surfaces 17.

Figure 14:
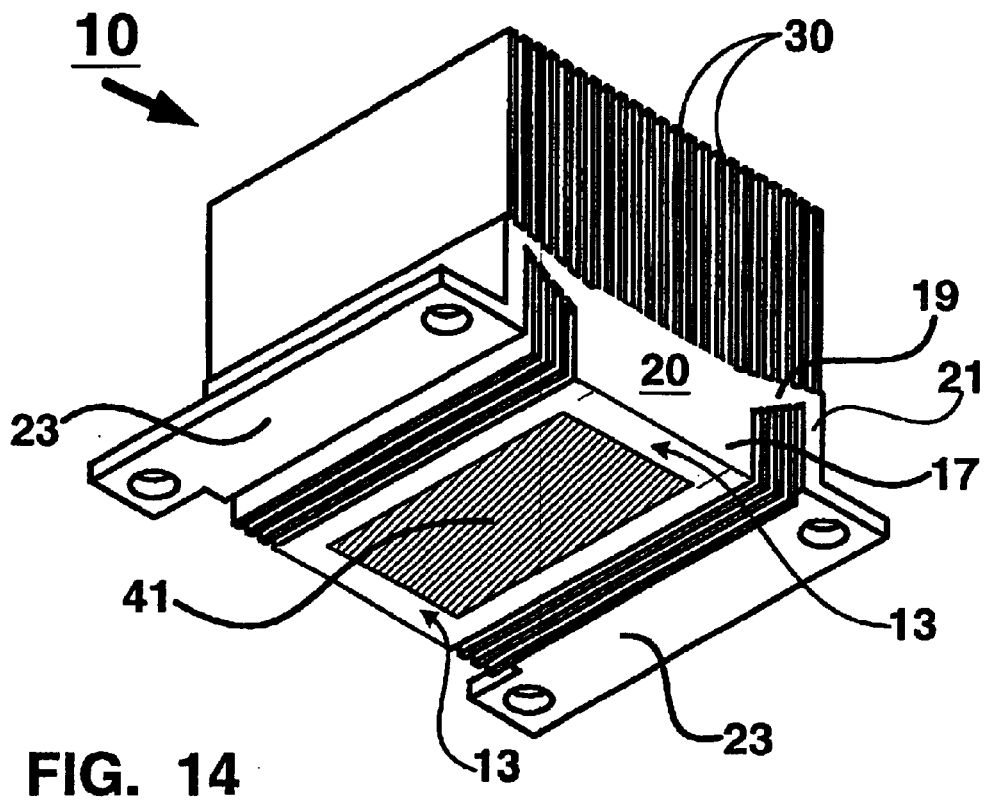
FIGS. 14 and 15 are bottom profile and cross-sectional views respectively of a thermal interface material connected with a mounting surface according to the present invention.
Figure 15:
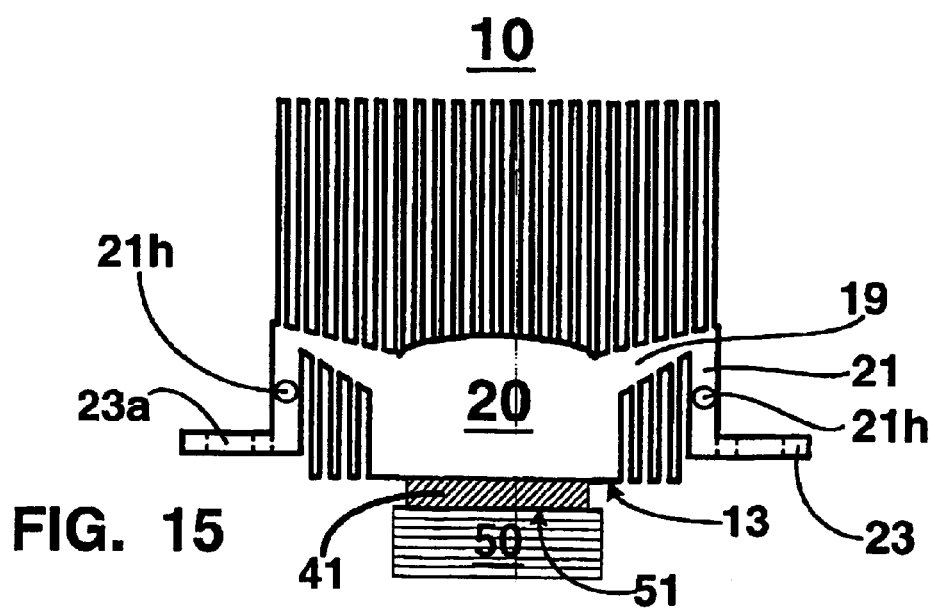

In another embodiment of the present invention, as illustrated in FIGS. 14 and 15, the side flow cooling device 10 includes a thermal interface material 41 connected with the mounting surface 13. The thermal interface material 41 is operative to thermally connect the heat mass 20 with a component 50 as depicted in the cross-sectional view of FIG. 15. For instance, the component 50 can be an electronic component, such as an ASIC.

Figure 16:
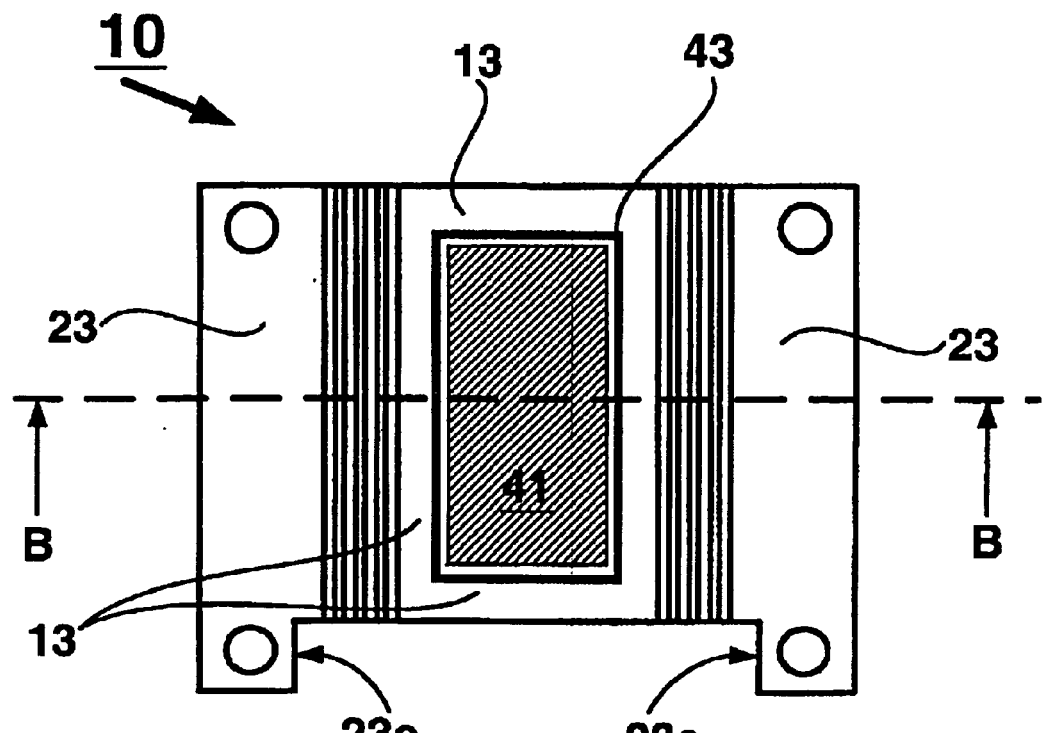
FIGS. 16 and 17 are bottom plan and cross-sectional views respectively of a thermal interface material in contact with a cavity in a heat mass according to the present invention.
Figure 17:
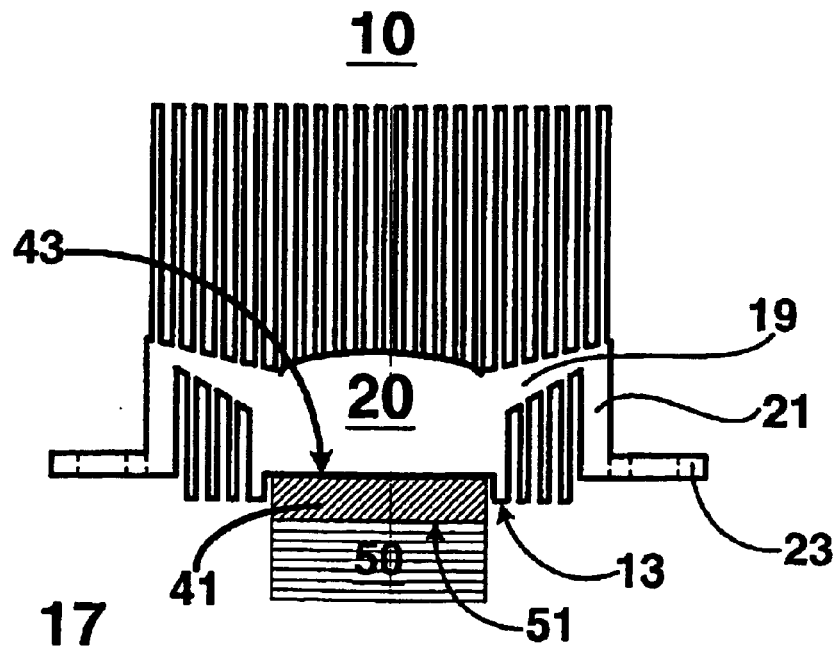

In yet another embodiment of the present invention, as illustrated in FIGS. 16 and 17, the side flow cooling device 10 includes a recessed portion that is inset from the mounting surface 13 (see FIG. 17) and defines a cavity 43 in the heat mass 20. A thermal interface material 41 is positioned in the cavity 43 and in contact with the heat mass 20. The thermal interface material 41 is operative to thermally connect the heat mass 20 with a component 50 as depicted in the cross-sectional view of FIG. 17.

The thermal interface material 41 provides a thermally conductive path for waste heat from a surface 51 of the component 50 to be thermally communicated to the mounting surface 13 and into the heat mass 20. Additionally, the thermal interface material 41 can seal micro voids (i.e. gaps) between the mounting surface 13 and the surface 51 thereby enhancing thermal transfer from the component 50 to the heat mass 20.

Suitable materials for the thermal interface material 41 include but are not limited to a thermally conductive paste, a thermally conductive grease, silicone, paraffin, a phase transition material, graphite, a coated aluminum foil, and carbon fiber. The thermal interface material 41 can be screen printed, pasted, or glued to the mounting surface 13, for example. Alternatively, thermal interface material 41 can be screen printed, pasted, or glued to the surface 51 of the component 50.

Figure 18:
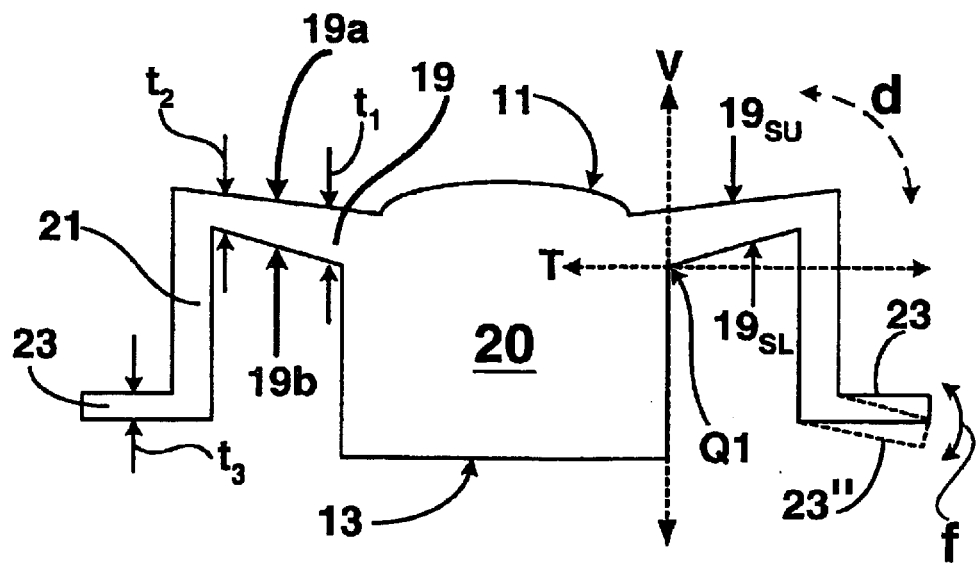
FIGS. 18, 19, and 20 are cross-sectional views depicting various configurations of a heat mass, an arm, a rib, and a wing according to the present invention.
Figure 19:
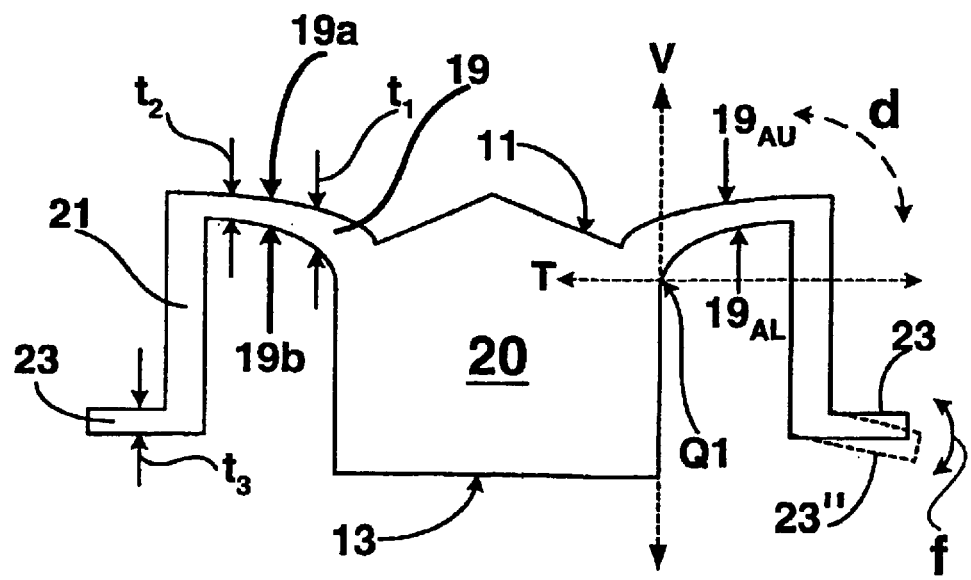
Figure 20:
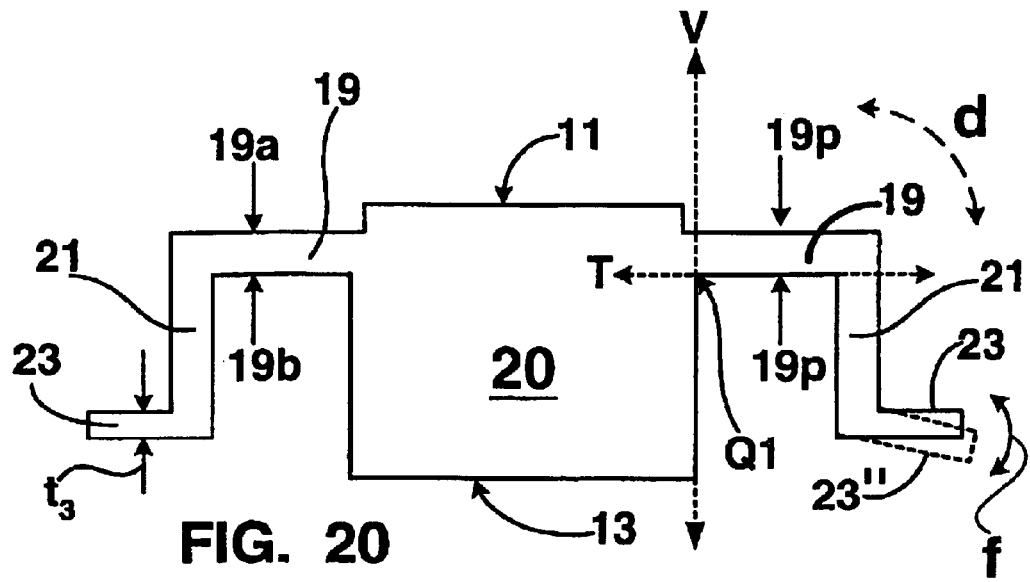
Figure 21:
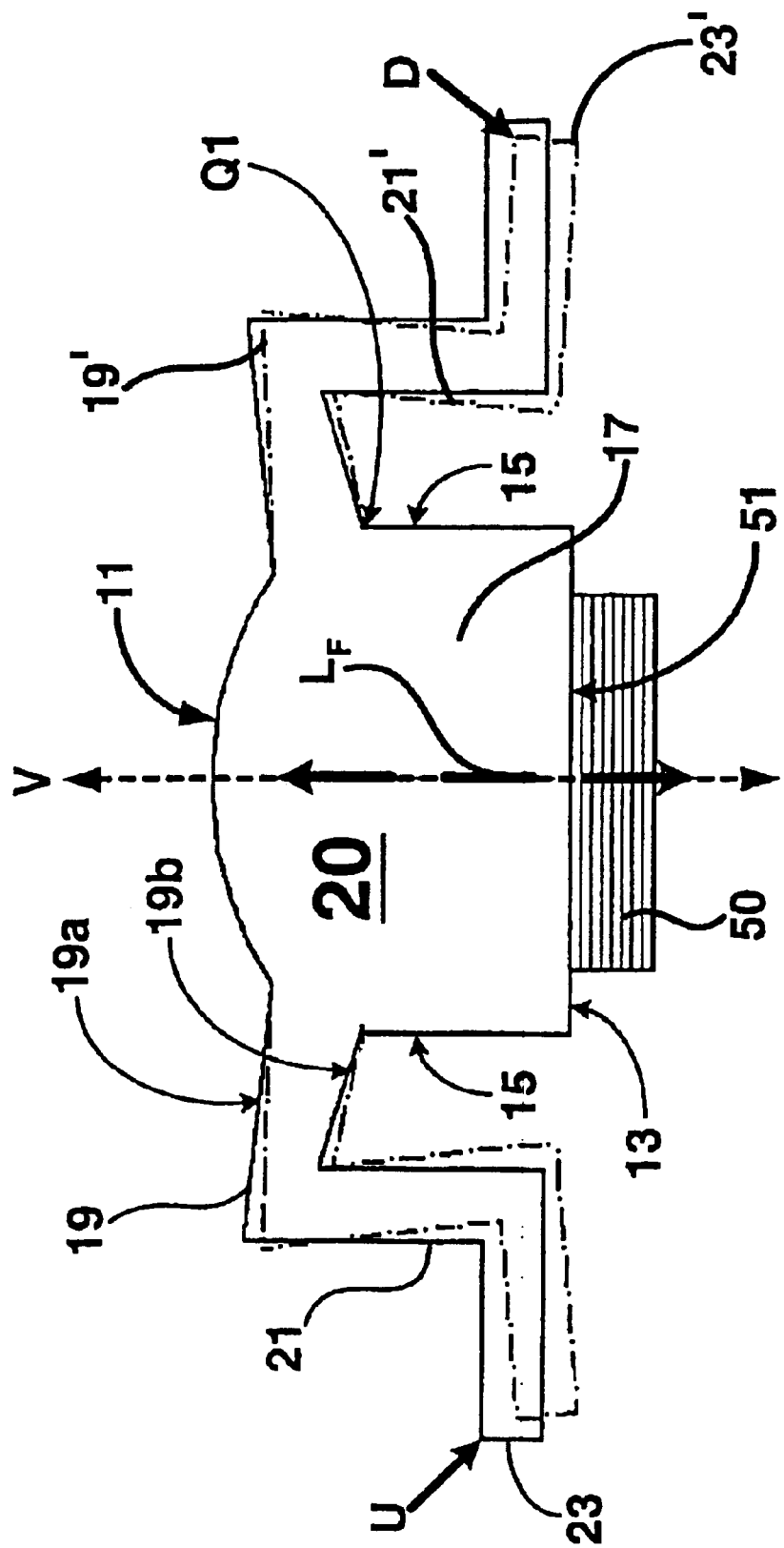
FIG. 21 is a cross-sectional view depicting flexure of an arm between un-deflected and deflected positions according to the present invention.

In alternative embodiments of the present invention, as illustrated in FIGS. 18, 19, 20, and 21, the top surface 11 of the heat mass 20 can have an arcuate shape as depicted in FIGS. 18 and 21, a sloped shape as depicted in FIG. 19, or a substantially planar shape (i.e. flat) as depicted in FIG. 20. Examples of an arcuate profile include but are not limited to a semi-circular shape and a conical shape. An arcuate or sloped profile for the top surface 11 provides for slight improvements in heat transfer from the heat mass 20 to the fins 30 when compared to flat or straight profiles such as the substantially planar shape $19p$ of FIG. 20.

In one embodiment of the present invention, as illustrated in FIGS. 18, 19, and 21, the arm 19 includes a positive slope relative to the vertical axis V and a first profile along the upper surface $19a$ of the arm 19 and extending from the top surface 11 of the heat mass 20 to the rib 21 and a second profile along the lower surface $19b$ of the arm 19 and extending from the opposed side surface 15 of the heat mass 20 to the rib 21.

Preferably, the second profile begins at a first quadrant Q1 where the lower surface $19b$ connects with the opposed side surface 15. The first and second profiles can be a sloped profile ($19_{SU}$, $19_{SL}$) as depicted in FIG. 18 or an arcuate profiles ($19_{AU}$, $19_{AL}$) as depicted in FIG. 19. The positive slope relative to the vertical axis V and the first and second profiles are operative to enable the arm 19 to deflect from an un-deflected position U to a deflected position D as depicted in FIG. 21. In a deflected state the arm, the rib, and the wing are denoted as 19', 21' and 23', respectively.

Benefits of deflection of the arm 19 include compensating for variations in manufacturing tolerances between one or more of the side flow cooling device 10, the component 50, a PC board the component 50 is mounted to, or a connector that the component 50 is mounted to. For instance, the mounting surface 13 and/or the surface 51 of the component may not be perfectly planar surfaces and the deflection in the arms 19 can compensate for imperfections in those surfaces.

A force required to deflect the arm 19 from the un-deflected position U to the deflected position D can be reduced by tapering the arm 19 so that the arm 19 has a first thickness $t_1$ at the opposed side surface 15 that tapers to a second thickness $t_2$ at the rib 21. The second thickness $t_2$ is less than the first thickness $t_1$ (i.e. $t_1 > t_2$).

Values for $t_1$ and $t_2$ can be calculated based on a desired mounting load for the side flow cooling device 10 and a tensile strength for the material selected for the side flow cooling device 10. As an example, aluminum (Al) with a tensile strength of 60.0 N/mm² would require a value of $t_1 = 5.0$ mm and $t_2 = 3.5$ mm where the side flow cooling device 10 is rated for a mounting load of 25 lbs.

Benefits of reducing the deflection force include reducing the possibility that a spring force exerted by the side flow cooling device 10 once it is mounted to the component 50 does not stress the component and a reduction in the force required to mount the side flow cooling device 10 with the component 50.

In another embodiment of the present invention, also illustrated in FIGS. 18, 19, and 20, the wing 23 has a thickness $t_3$ that is preselected to allow the wing 23 to flex f (denoted by dashed lines 23" depicting the wing in a flexed state) when the side flow cooling device 10 is connected with the component 50. The flex f includes a slight deflection in the arm 19 and the rib 21 (see dashed arrow d) with a pivot point for the slight deflection d at the first quadrant Q1.

The range of the flex f can be from 0.0 mm to 1.0 mm and the flex f is over a smaller range than the aforementioned deflection of the arm 19. As an example, for aluminum (Al) with a tensile strength of 60.0 N/mm² a value for the thickness $t_3$ of the wing 23 can be from about 4.0 mm to about 1.5 mm. The actual value for the thickness $t_3$ will depend an several factors including the application, the desired mounting load, and the material selected for the side flow cooling device 10, just to name a few.

In the embodiment depicted in FIG. 20, the substantially planar profile $19p$ of the arm 19 does not allow for substantial deflection of the arm as described above in reference to FIGS. 18 and 19; however, flex f is operative to provide the slight deflection d.

The flex f can also be used to compensate for variations in manufacturing tolerances as was described above in reference to deflection of the arm 19 and to ensure contact between the component 50 and the mounting surface 13 so that heat is efficiently transferred from the component 50 to the heat mass 20. The flex f also aids in centering the heat mass 20 over the component 50 so that a load force $L_F$ exerted by the side flow cooling device 10 on the component 50 and a counter load force $L_F$ exerted by the component 50 on the side flow cooling device 10 (see FIG. 21) are substantially aligned along the vertical axis V.

In an alternative embodiment, as illustrated in FIG. 20, the arm 19 has a substantially planar profile $19p$ (i.e. flat) on the upper and lower surfaces ($19a$, $19b$). The configuration of FIG. 20 can be used in those applications where a large deflection of the arm 19 is not necessary or where simplicity in manufacturing is desired. Moreover, the wing 23 can have its thickness $t_3$ preselected to allow for the flex f that can be used to achieve some of the above mentioned benefits that were obtained by the profiled and tapered arms 19 of FIGS. 18, 19, and 21.

Figure 22:
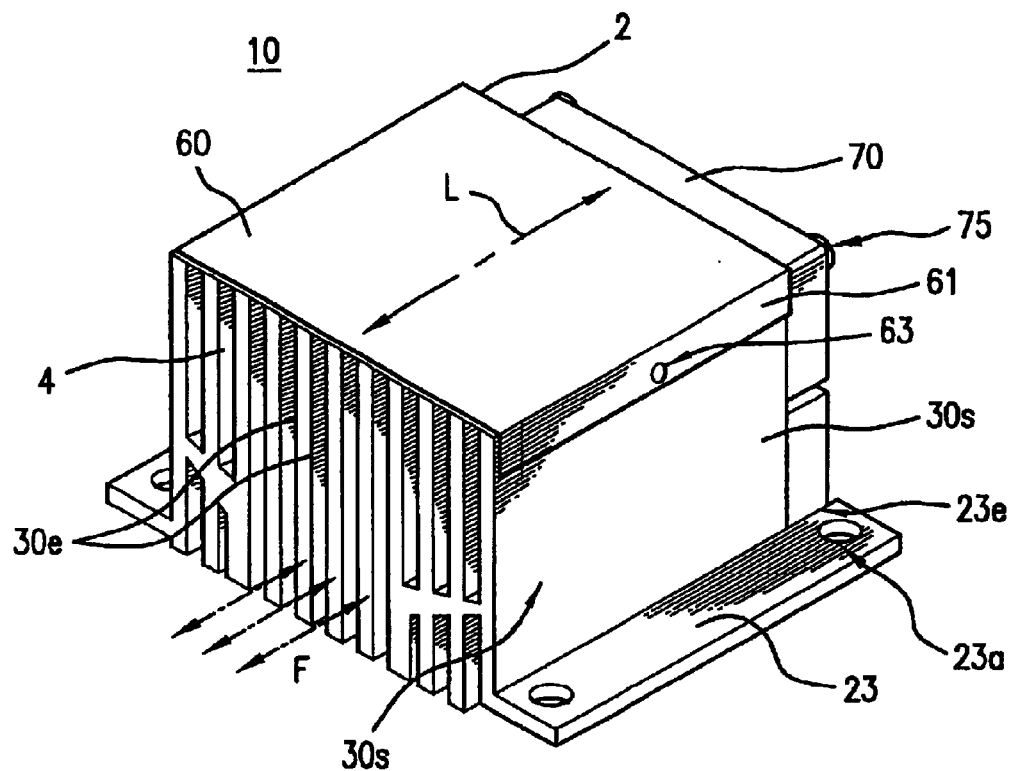
FIGS. 22 and 23 are profile views depicting an air flow source connected with side faces of a side flow cooling device according to the present invention.
Figure 23:
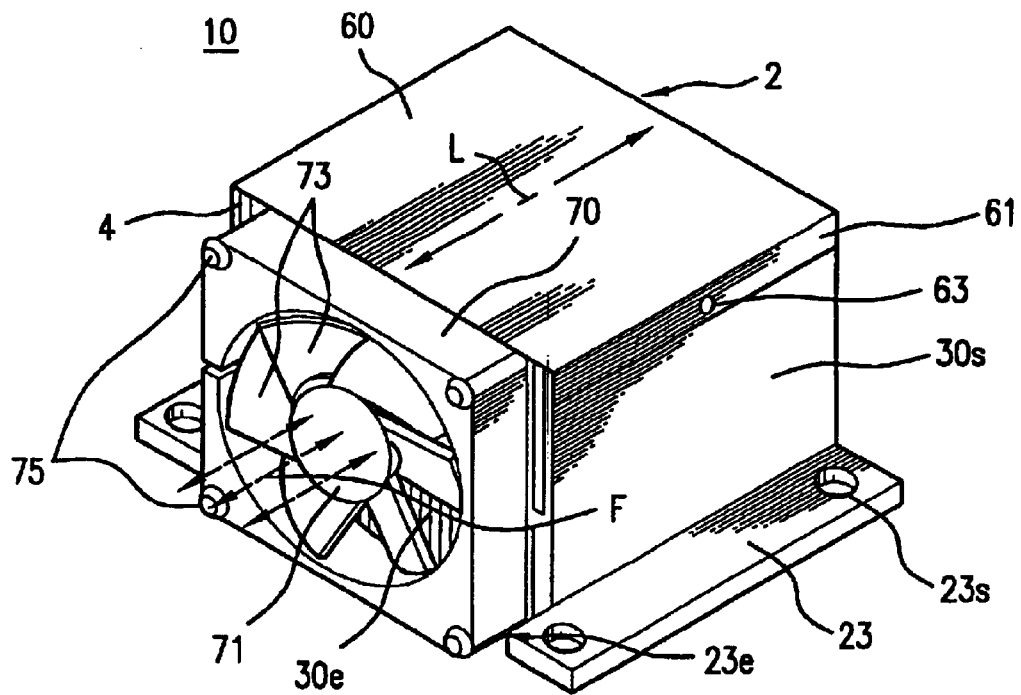

In one embodiment of the present invention, as illustrated in FIGS. 22 and 23, the side flow cooling device 10 includes a cover 60 that is positioned adjacent to the top edges $30t$ of the fins 30 and is operative to prevent the air flow F from exiting the fins 30 through the top edges $30t$ and to constrain the air flow F in a direction that is substantially along the longitudinal axis L.

The cover 60 can be in contact with the top edges $30t$ of the fins 30, the cooling surfaces $30s$ of the fins 30, or both the top edges $30t$ and the cooling surfaces $30s$ of the fins 30.

For example, the cover 60 can include an aperture 63 through which a fastener (not shown) can be inserted to connect the cover 60 with the outermost set of cooling surfaces 30s. Preferably, the cover 60 is urged into contact with the top edges 30t of the fins 30 so that there are no gaps between the top edges 30t and the cover 60 and the air flow F is constrained to flow over the cooling surfaces 30s and the exposed surfaces of the heat mass 20 only. Moreover, if there is a gap between the cover 60 and the top edges 30t, then the air flow F might generate noise as it flows through the space.

The cover 60 can be connected with the side flow cooling device 10 using methods including but not limited to a fastener, welding, a spring, gluing, and an adhesive, just to name a few.

Figure 24:
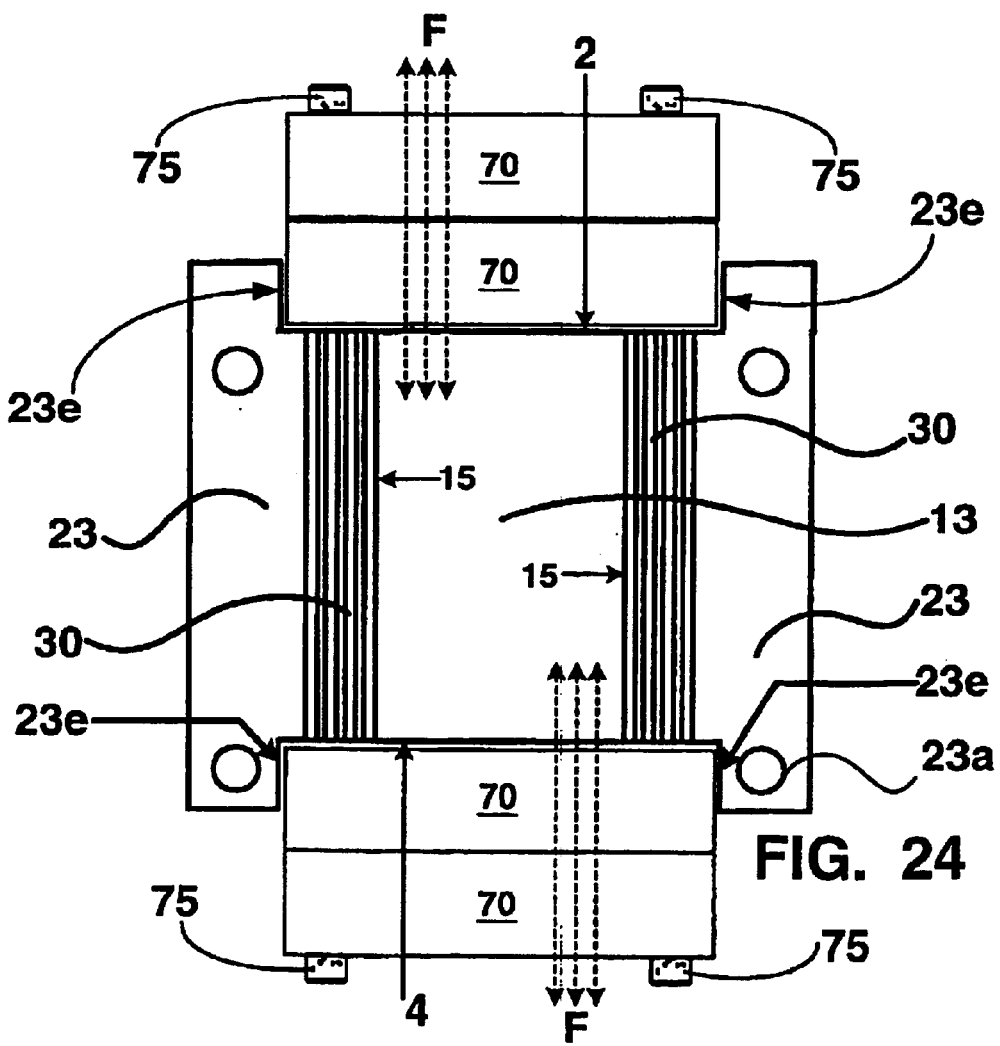
FIG. 24 is a bottom plan view of a plurality of air flow sources connected with side faces of a side flow cooling device according to the present invention.

In another embodiment of the present invention, as illustrated in FIGS. 22, 23, and 24, side flow cooling device 10 includes at least one air flow source 70 that is operative to generate the air flow F in the direction that is substantially along the longitudinal axis L. The air flow source 70 is positioned adjacent to the first side face 2, the second side face 4, or the first side face 2 and the second side face 4.

The air flow source 70 can be source that includes but is not limited to a fan and a system fan. A system fan is one that is used in a system to cool the system as well as to generate the air flow F for the side flow cooling device 10. A fan is one that is dedicated to generating the air flow F for the side flow cooling device 10.

The air flow source 70 can be connected with the cooling surfaces 30s of the fins 30. For example, if the air flow source 70 is a fan, then a fastener 75 can be used to connect the fan with the cooling surfaces 30s of the fins 30. Threads on the fastener 75 can be inserted into the slot S to engage the cooling surfaces 30s thereby connecting the fan with the side flow cooling device 10 and positioning the fan adjacent to the side faces (2, 4) so that air flow F generated by the fan enters the slots S between the fins 30 in the direction that is substantially along the longitudinal axis L.

In FIG. 22, the air flow source 70 is positioned adjacent to the first side face 2. The air flow source can be in direct contact with the side faces (2, 4). The air flow F generated by the air flow source 70 can be such that the air flow F is pulled (i.e. drawn or sucked) over the cooling surfaces 30s of the fins 30 or is pushed (i.e. blown) over the cooling surfaces 30s of the fins 30.

Similarly, in FIG. 23, the air flow source 70 is positioned adjacent to the second side face 4 and the air flow F can be pulled or pushed over the cooling surfaces 30s of the fins 30. For example, the air flow source 70 can be a fan with a hub 71 and fan blades 75 connected with the hub 71 to generate the air flow F when the hub 71 is rotated by a motor (not shown).

One advantage of the side flow cooling device 10 is that it dissipates heat from the heat mass 20 with a bidirectional air flow F. That is, the air flow F can be in either direction along the longitudinal axis L as depicted by the dashed arrows F.

In FIG. 24, the air flow source 70 is positioned adjacent to both the first and second side faces (2, 4). Moreover, more than one air flow source 70 (two are shown) can be positioned adjacent to the first and second side faces (2, 4). Because the air flow F can be bi-directional, the air flow sources 70 positioned at the first side face 2 can push air through the side flow cooling device 10 and the air flow sources 70 positioned at the second side face 4 can pull air through the side flow cooling device 10, or vice-versa.

There are many possible arrangements for side mounted air flow sources 70. For instance, an air flow source 70 can be positioned at each of the side faces (2, 4). One of the sources 70 can be a redundant air flow source 70 in the event the other air flow source 70 fails. Alternatively, both air flow sources 70 can be operated in the aforementioned push-pull configuration.

Another possible configuration is two or more of the air flow sources 70 positioned at the same side face, that is, at the side face 2 or at the side face 4. One of the air flow source 70 can be a backup air flow source 70 for redundancy or both air flow sources 70 can be operated simultaneously to increase the air flow F.

In FIG. 24, fasteners 75 are used to connect the air flow sources 70 with each other and to their respective side faces (2, 4). Other methods of connecting the air flow source 70 with the side faces (2, 4) can be used and the present invention is not limited to the forms set forth herein. For example, clips, springs, or a fan mounting ring can be used to effectuate the connection.

Figure 25:
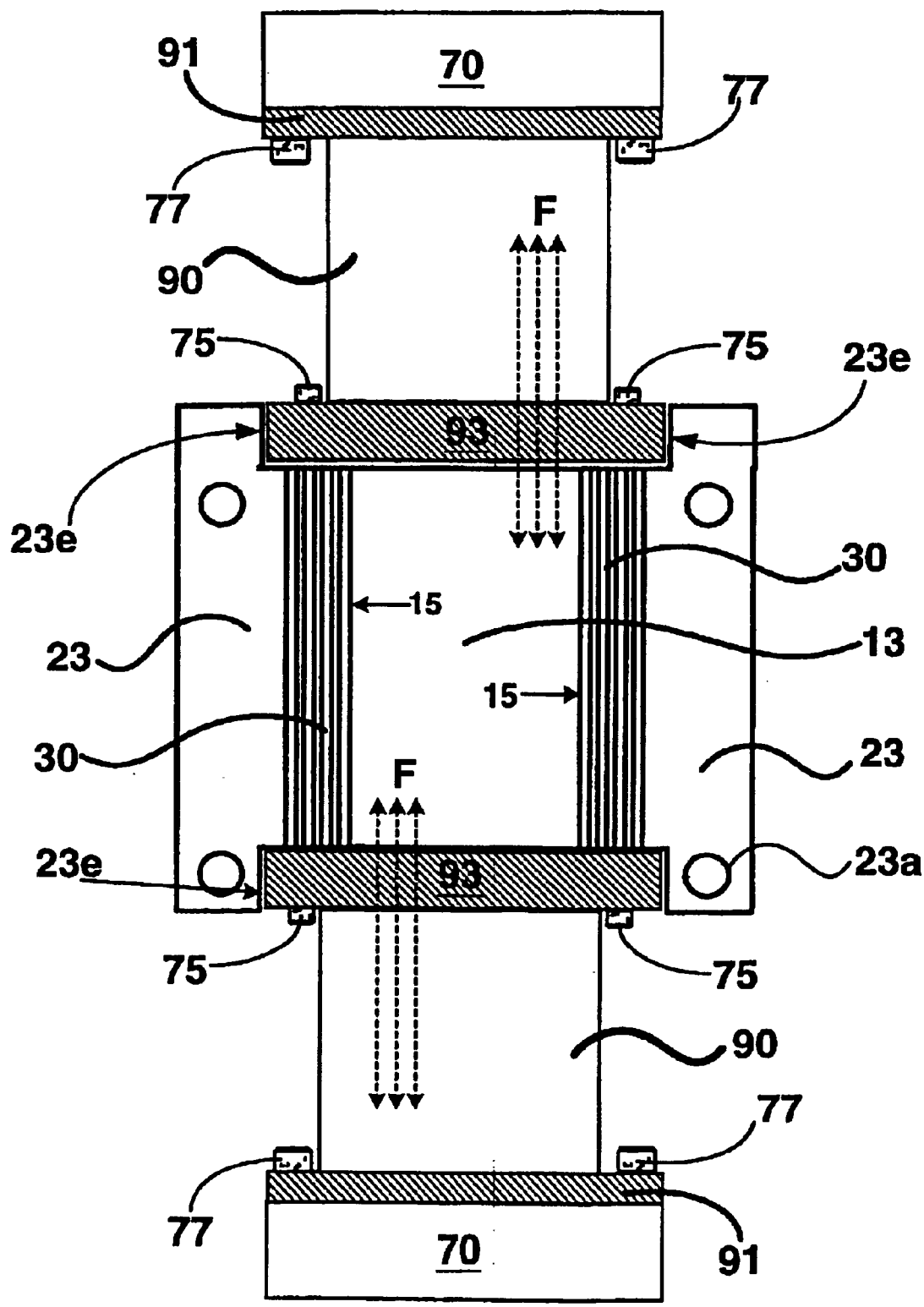
FIG. 25 is a bottom plan view of a duct and an air flow source connected with a side flow cooling device according to the present invention.

In FIG. 25, the side flow cooling device 10 includes at least one duct 90 including a first opening 91 and a second opening 93. The second opening 93 can be positioned adjacent to the first side face 2, the second side face 4, or both the first and second side faces (2, 4) when two of the ducts 90 are used. The duct 90 is operative to channel the air flow F in the direction substantially along the longitudinal axis L. The first opening 91 is connected to at least one air flow source 70 that is operative to generate the air flow F. The air flow F can be bidirectional. The duct 90 can have a cross-sectional profile that includes but is not limited to a circular profile and a rectangular profile. Preferably, the duct 90 has a circular cross-sectional profile.

The wings 23 can include an extended portion 23e (see FIG. 3 and FIGS. 22 through 25) that extends outward of the side faces (2, 4) and is adapted to align the air flow source 70 with the side faces (2, 4) and to position the air flow source 70 for mounting with the side flow cooling device 10. For example, provided that the rib 21 is thick enough, the rib 21 can include a hole 21h (see FIG. 15) that is tapped to receive a threaded fastener that connects the air flow source 70 (e.g. a fan) with either one or both of the side faces (2, 4). Similarly, the alignment of the air flow source 70 with the side faces (2, 4) can be used to align holes in the air flow source 70 with the slot S between the fins 30 for insertion of a fastener to connect the air flow source 70 with the side flow cooling device 10.

The duct 90 can be connected with side faces (2, 4) and the air flow source 70 using fasteners (75, 77), for example. Fasteners 77 can be used to connect the first opening 91 with the air flow source 70 and fasteners 75 can be used to connect the second opening 93 with the side faces (2, 4). As was previously described, the air flow source 70 can be a fan or a system fan and one or more fans can be connected with the first opening 91. The first and second openings (91, 93) need not have the same shape as the duct 90. For example, if the duct 90 has a circular cross-section, then it may be desirable for the first and second ends (91, 93) to have a rectangular cross-section that complements a shape of the side faces (2, 4) and/or the air flow source 70 to facilitate mounting the duct 90 with the side faces (2, 4) and the air flow source 70.

The extended portion 23e can serve an identical function in connection with the use of the duct 90 wherein a flange or other portion of the second opening 93 of the duct 90 is positioned between the extended portion 23e and aligned with the side faces (2, 4). Fasteners can be used to connect the second opening 93 with the slot S between the fins 30 or with the tapped hole 21h in the rib 21, for example.

Figure 26:
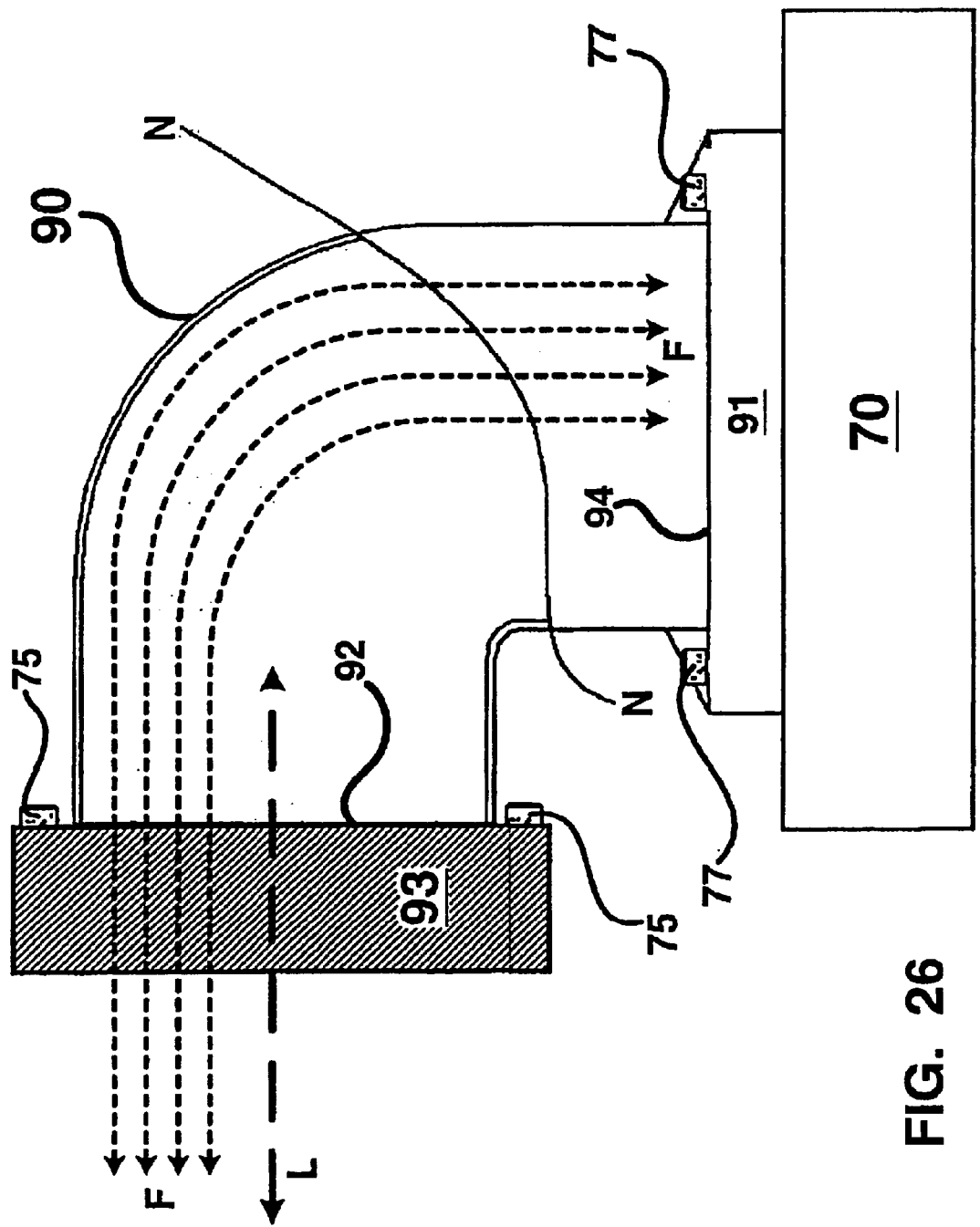
FIG. 26 is a partial cross-sectional view along line N—N depicting a duct connected with an air flow source according to the present invention.

The duct 90 need not be straight as illustrated in FIG. 25. In FIG. 26, the duct 90 has a circular cross-section and also includes a 90 degree bend. The duct 90 channels the air flow F from the air flow source 70 to the second opening 93 such that when the air flow reaches the second opening 93 it enters the side faces (2, 4) in the direction that is substantially along the longitudinal axis L.

The material for the duct 90 will be application dependent; however, for electronics applications the duct 90 should be made from a material that can withstand temperatures of at least 45.0 degrees Centigrade. Suitable materials include but are not limited to plastic, sheet metal, or rubber. For example, molded plastic can be used for the duct 90.

Materials for the side flow cooling device 10 include but are not limited to high thermal conductivity metals, gold (Au), copper (Cu), silver (Ag), silicon substrate (Si), aluminum (Al), alloys of the aforementioned materials, and combinations of the aforementioned materials. For example, a cooper plug on an aluminum body or a silicon substrate base with an aluminum body.

The side flow cooling device 10 can be manufactured using a variety of processes including but not limited to extrusion followed by machining. For example, the heat mass 20, the arm 19, the rib 21, the wing 23, and the fins 30 can be formed by an extrusion process. The extrusion is cut off to a desired length for the side flow cooling device 10. The bottom of the cut-off extrusion is then machined to form the mounting surface 13. A process such a grinding or polishing can be used to obtain the desired surface finish for the mounting surface 13.

The wings 23 can have holes drilled or punched therein to form the apertures 23a. The fins 30 can be machined along the cooling surfaces 30s to improve the surface finish of the cooling surfaces 30s so that noise from the air flow F over the cooling surface 30s is reduced. The hole 21h can be drilled into the rib 21 and tapped, if desired, to accommodate a threaded fastener.

Alternatively, the side flow cooling device 10 can be fully machined, die casted, or an impact forged from a raw material. The fins 30 can be homogeneously formed with the heat mass 20 through dip brazing or vacuum brazing. The brazing process can be used to increase the surface area available for cooling by brazing thin sheet metal fins to the heat mass 20.

Preferably, the side flow cooling device 10 is extruded and then machined so that the heat mass 20, the arm 19, the rib 21, the wing 23, and the plurality of fins 30 are a homogeneously formed unit.

The cover 60 can be made from the same material as the side flow cooling device 10 or from a formed metal, sheet metal, molded plastic, or thermo formed plastics.

Figure 13:
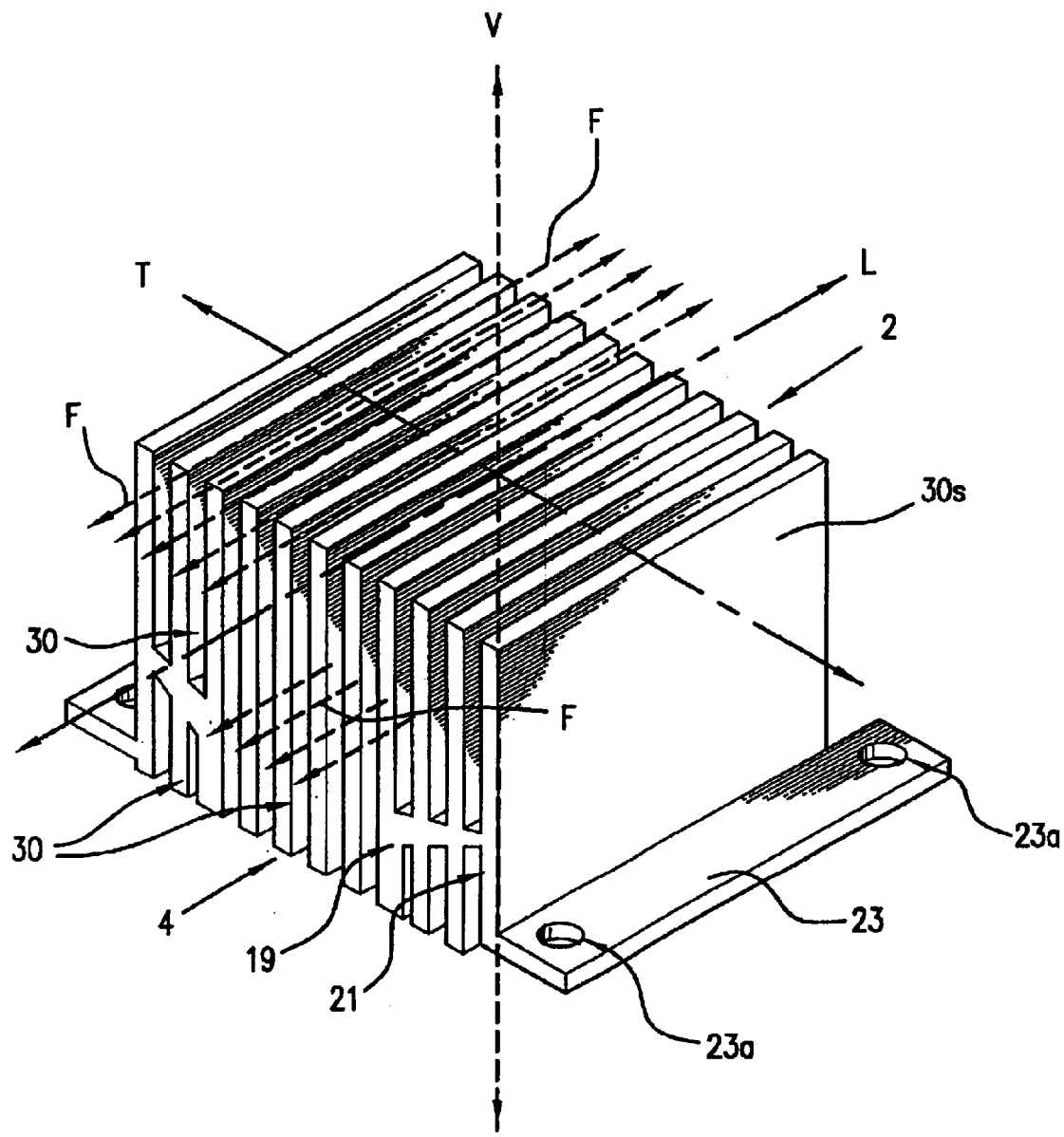
FIG. 13 is a top profile view depicting an air flow through the fins and spatial relationships between axes of a side flow cooling device according to the present invention.

In FIGS. 3, 10, and 13, the opposed side surfaces 15 are depicted as being substantially parallel with the longitudinal axis L of the heat mass 20 and the opposed end surfaces 17 are depicted as being substantially parallel with a transverse axis T of the heat mass 20. The surfaces (15, 17) need not be parallel with the aforementioned axes and the surfaces (15, 17) need not be planar surfaces. Planar and parallel surfaces may be desirable for some manufacturing processes such as extrusion, for example. However, the actual shapes of the surfaces (15, 17) are not limited to those set forth herein.

Although several embodiments of the present invention have been disclosed and illustrated, the invention is not limited to the specific forms or arrangements of parts so described and illustrated. The invention is only limited by the claims.

What is claimed is:

1. A side flow cooling device for dissipating heat from a component, comprising:
    a heat mass including a top surface, a mounting surface adapted to thermally connect the heat mass with the component, opposed side surfaces, and opposed end surfaces;
    an arm in contact with the heat mass and extending outward of the opposed side surfaces, the arm including a upper surface and a lower surface;
    a rib connected with the arm and extending downward of the arm;
    a plurality of fins substantially aligned with a vertical axis of the heat mass and connected with the top surface of the heat mass and the upper and lower surfaces of the arm, each fin including opposed cooling surfaces, a top edge, opposed end edges that define a first side face and a second side face of the side flow cooling device, the fins are spaced apart to define a slot therebetween, and the slot and the opposed cooling surfaces are substantially aligned with a longitudinal axis of the heat mass; and
    a wing connected with the rib and extending outward therefrom, the wing is operative to connect the mounting surface of the side flow cooling device with the component, and the wing further including an extended portion extending outward of either one or both of the first or second side faces and the extended portion is adapted to align the an air flow source with the side faces,
    wherein an air flow entering either of the first or second side faces in a direction substantially along the longitudinal axis passes through the slots and over the opposed cooling surfaces and the heat mass to dissipate heat from the heat mass.

2. The side flow cooling device as set forth in claim 1, wherein the top surface of the heat mass includes a shape selected from the group consisting of an arcuate shape, a sloped shape, and a substantially planar shape.

3. The side flow cooling device as set forth in claim 1 wherein the heat mass is thermally connected with the component by a direct connection between the mounting surface and the component.

4. The side flow cooling device as set forth in claim 1 and further comprising a thermal interface material connected with the mounting surface and operative to thermally connect the heat mass with the component.

5. The side flow cooling device as set forth in claim 1 and further comprising:
    a recessed portion inset from the mounting surface and defining a cavity in the heat mass; and
    a thermal interface material positioned in the cavity and in contact with the heat mass and operative to thermally connect the heat mass with the component.

6. The side flow cooling device as set forth in claim 1 and further comprising a cover positioned adjacent to the top edges of the fins and operative to prevent the air flow from exiting the fins through the top edges of the fins and to constrain the air flow in the direction substantially along the longitudinal axis.

7. The side flow cooling device as set forth in claim 6, wherein the cover is in contact with a selected one of the top edges of the fins, the opposed cooling surfaces, or the top edges of the fins and the opposed cooling surfaces.

8. The side flow cooling device as set forth in claim 1, wherein the heat mass, the arm, the rib, the wing, and the plurality of fins are a homogeneously formed unit.

9. The side flow cooling device as set forth in claim 1 and further comprising at least one air flow source operative to generate the air flow in the direction substantially along the longitudinal axis, the air flow source is positioned adjacent to a selected one of the first side face, the second side face, or the first side face and the second side face.

10. The side flow cooling device as set forth in claim 9, wherein the air flow source is a source selected from the group consisting of a fan and a system fan.

11. The side flow cooling device as set forth in claim 9, wherein the air flow source is connected with the cooling surfaces of the fins.

12. The side flow cooling device as set forth in claim 1 and further comprising:

at least one duct, the duct including a first opening and a second opening, the second opening is positioned adjacent to a selected one of the first side face, the second side face, or the first side face and the second side face, the duct is operative to channel the air flow in the direction substantially along the longitudinal axis; and at least one air flow source connected with the first opening and operative to generate the air flow in the duct.

13. The side flow cooling device as set forth in claim 12, wherein the air flow source is a source selected from the group consisting of a fan and a system fan.

14. The side flow cooling device as set forth in claim 1, wherein the arm further comprises:

a positive slope relative to the vertical axis a first profile along the upper surface of the arm, and extending from the top surface of the heat mass to the rib; and a second profile along the lower surface of the arm and extending from the opposed side surface to the rib, the first and second profiles have a profile selected from the group consisting of sloped profile and an arcuate profile, and wherein the positive slope and the first and second profiles are operative to enable the arm to deflect from an un-deflected position to a deflected position.

15. The side flow cooling device as set forth in claim 14, and further comprising a taper in the arm that tapers from a first thickness at the opposed side surface to a second thickness at the rib, the second thickness is less that the first thickness, and wherein the taper in the arm is operative to reduce a force required to deflect the arm from the un-deflected position to the deflected position.

16. The side flow cooling device as set forth in claim 1, wherein the wing has a thickness preselected to allow the wing to flex when the mounting surface of the side flow cooling device is connected with the component.

17. The side flow cooling device as set forth in claim 1, wherein the opposed end surfaces of the heat mass further includes a plurality of the fins connected with the opposed end surfaces and extending outward therefrom, the fins are substantially aligned with the vertical axis of the heat mass.

18. The side flow cooling device as set forth in claim 1, wherein the air flow passes over the upper surface and the lower surface of the arm to dissipate heat from the heat mass.

19. The side flow cooling device as set forth in claim 1, wherein the component is an electronic component.

20. The side flow cooling device as set forth in claim 1, wherein the upper and lower surfaces of the arm have a substantially planar profile.

\* \* \* \* \*